(12) United States Patent
Choi

(10) Patent No.: US 12,368,130 B2
(45) Date of Patent: Jul. 22, 2025

(54) MODULE FOR REMOVING MISASSEMBLED SEMICONDUCTOR LIGHT-EMITTING ELEMENT, AND METHOD USING SAME TO REMOVE MISASSEMBLED SEMICONDUCTOR LIGHT-EMITTING ELEMENT

(71) Applicant: LG ELECTRONICS INC., Seoul (KR)

(72) Inventor: Juchan Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 591 days.

(21) Appl. No.: 17/628,378

(22) PCT Filed: Aug. 5, 2019

(86) PCT No.: PCT/KR2019/009699
§ 371 (c)(1),
(2) Date: Jan. 19, 2022

(87) PCT Pub. No.: WO2021/025184
PCT Pub. Date: Feb. 11, 2021

(65) Prior Publication Data
US 2022/0406748 A1 Dec. 22, 2022

(51) Int. Cl.
*H01L 23/00* (2006.01)
(52) U.S. Cl.
CPC ............ *H01L 24/799* (2013.01); *H01L 24/98* (2013.01); *H01L 2924/12041* (2013.01)

(58) Field of Classification Search
CPC .................. H01L 24/799; H01L 24/98; H01L 2924/12041; H01L 2224/7999; H01L 2224/98
See application file for complete search history.

(56) References Cited

U.S. PATENT DOCUMENTS

| 7,687,277 B2 | 3/2010 | Sharma et al. | |
| 10,832,933 B1 * | 11/2020 | Brodoceanu | ........ H01L 21/6835 |
| 12,046,484 B2 * | 7/2024 | Choi | .................... H01L 25/0753 |

(Continued)

FOREIGN PATENT DOCUMENTS

| EP | 2688093 | 1/2014 | |
| EP | 2688093 A1 * | 1/2014 | ........... B23K 1/0016 |

(Continued)

OTHER PUBLICATIONS

European Patent Office Application Serial No. 19940235.5, extended Search Report dated Dec. 9, 2022, 7 pages.

(Continued)

*Primary Examiner* — George R Koch
(74) *Attorney, Agent, or Firm* — LEE, HONG, DEGERMAN, KANG & WAIMEY

(57) ABSTRACT

A removal module for removing a mis-assembled semiconductor light emitting diode includes a housing having an inner space formed by an upper plate having a nozzle hole and a lower plate spaced apart from the upper plate; a fluid supply part configured to supply a fluid outside the housing to the inner space; and a fluid control part configured to control spray of the fluid supplied to the inner space through the nozzle hole by adjusting a pressure of the inner space.

8 Claims, 14 Drawing Sheets

(56) References Cited

U.S. PATENT DOCUMENTS

| | | | |
|---|---|---|---|
| 2008/0032425 | A1 | 2/2008 | Hillis et al. |
| 2010/0302322 | A1* | 12/2010 | Wang .................. B41J 2/1632 |
| | | | 347/68 |
| 2013/0027623 | A1 | 1/2013 | Negishi et al. |
| 2015/0223346 | A1 | 8/2015 | Serre et al. |
| 2015/0367641 | A1* | 12/2015 | Giusti .................. B41J 2/14064 |
| | | | 347/61 |
| 2017/0140961 | A1 | 5/2017 | Sasaki et al. |
| 2018/0029038 | A1* | 2/2018 | Sasaki .................. G09G 3/006 |
| 2018/0102352 | A1 | 4/2018 | Sasaki et al. |
| 2018/0374738 | A1 | 12/2018 | Lee et al. |
| 2022/0254657 | A1 | 8/2022 | Choi |
| 2022/0415859 | A1 | 12/2022 | Choi et al. |

FOREIGN PATENT DOCUMENTS

| | | |
|---|---|---|
| EP | 4002440 | 5/2022 |
| JP | 2008525206 | 7/2008 |
| JP | 2015527739 | 9/2015 |
| KR | 10-2012-0138805 | 12/2012 |
| KR | 101545186 | 8/2015 |
| KR | 10-2019-0085892 | 7/2019 |
| KR | 20200026689 | 3/2020 |

OTHER PUBLICATIONS

PCT International Application No. PCT/KR2019/009699, International Search Report dated May 6, 2020, 6 pages.
Korean Intellectual Property Office Application No. 10-2022-7002272, Notice of Allowance dated Jan. 17, 2025, 7 pages.

* cited by examiner

[FIG. 1]
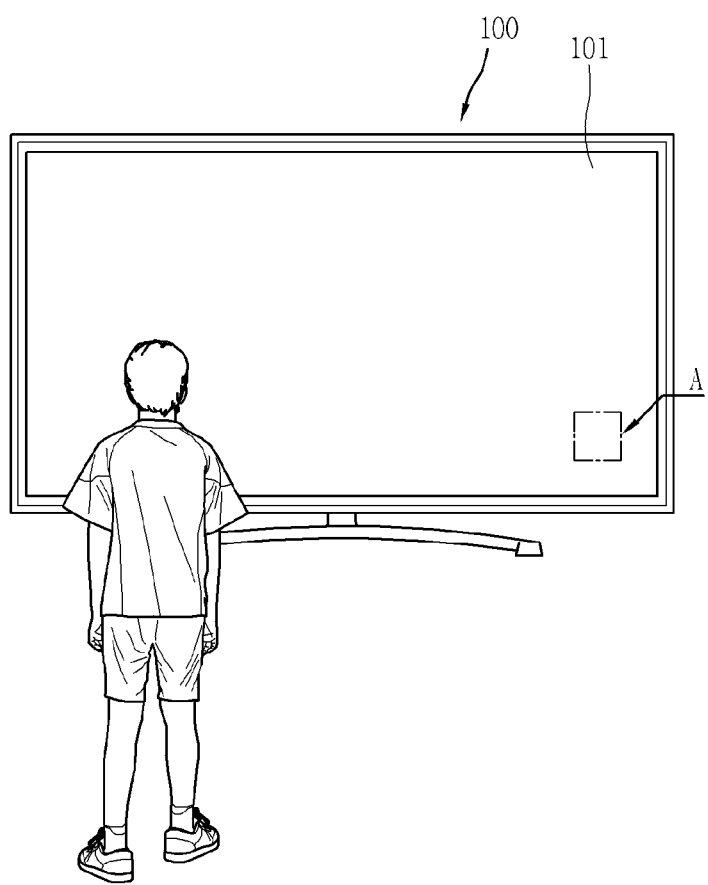

[FIG. 2]
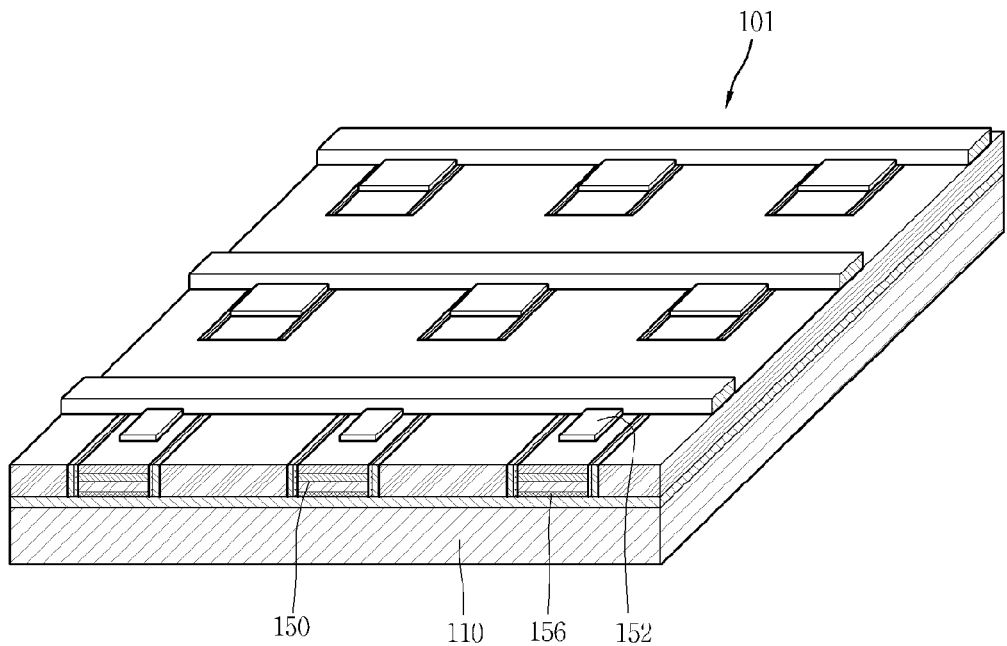

[FIG. 3]
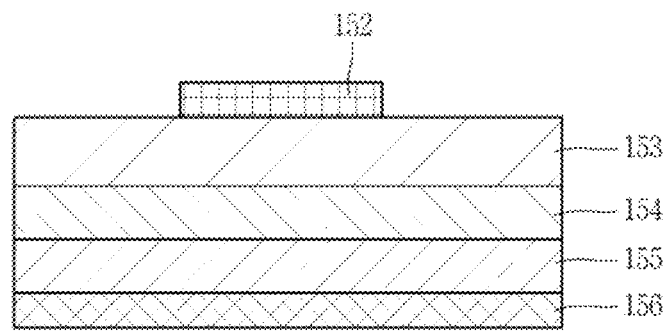
[FIG. 4]
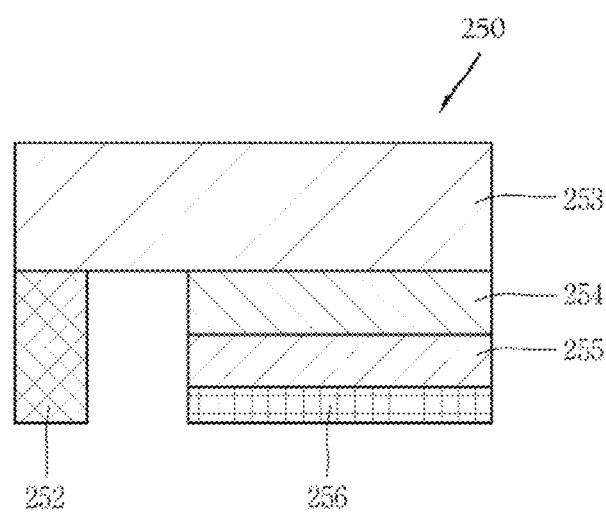

[FIG. 5a]
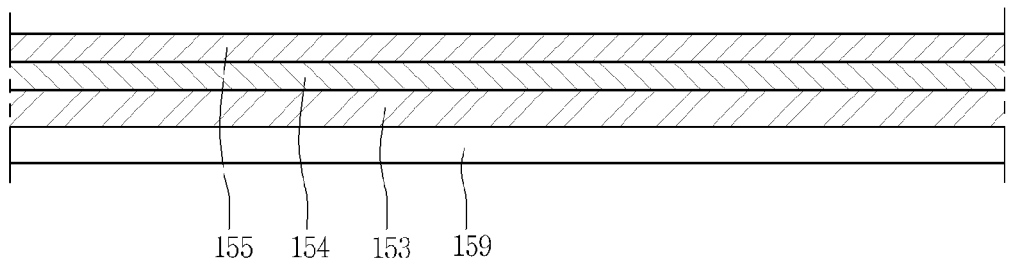
[FIG. 5b]
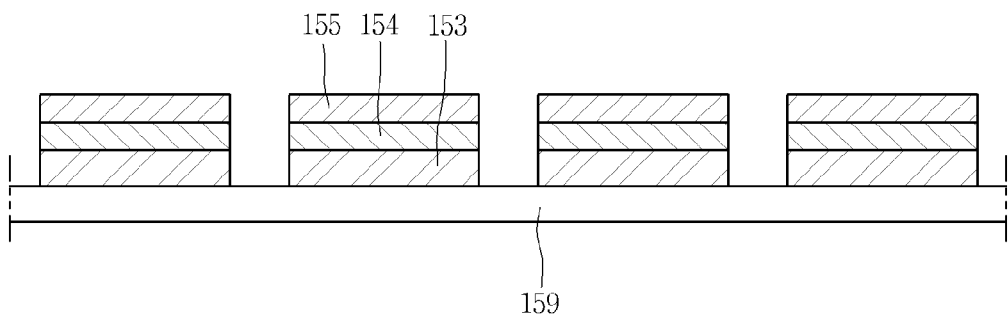
[FIG. 5c]
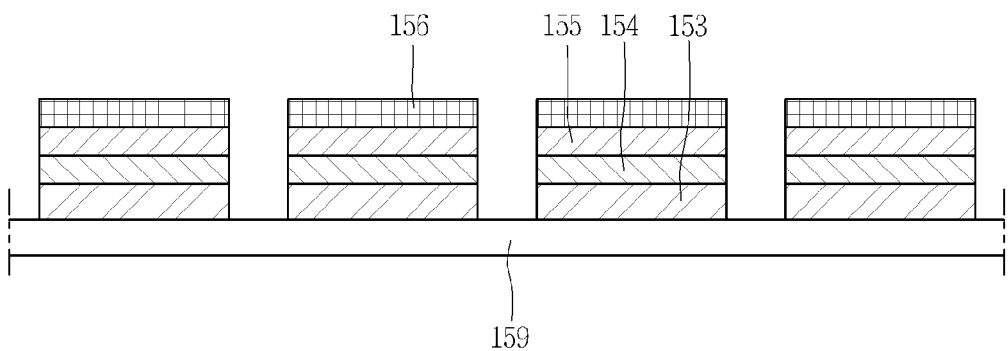

[FIG. 5d]
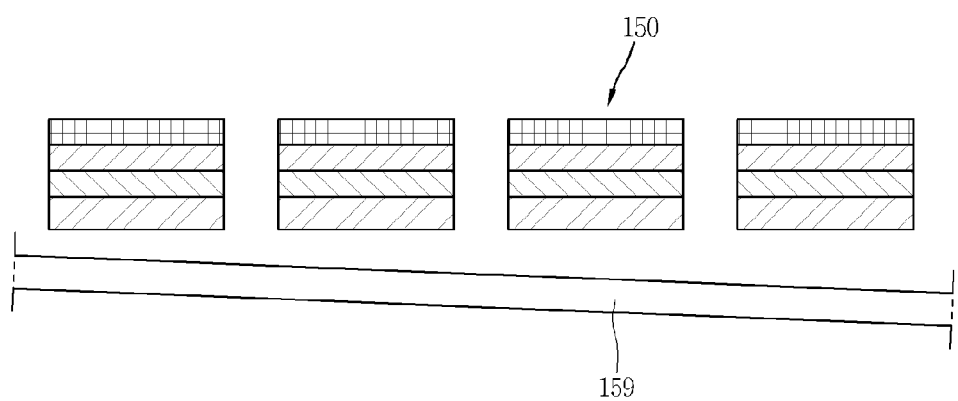
[FIG. 5e]
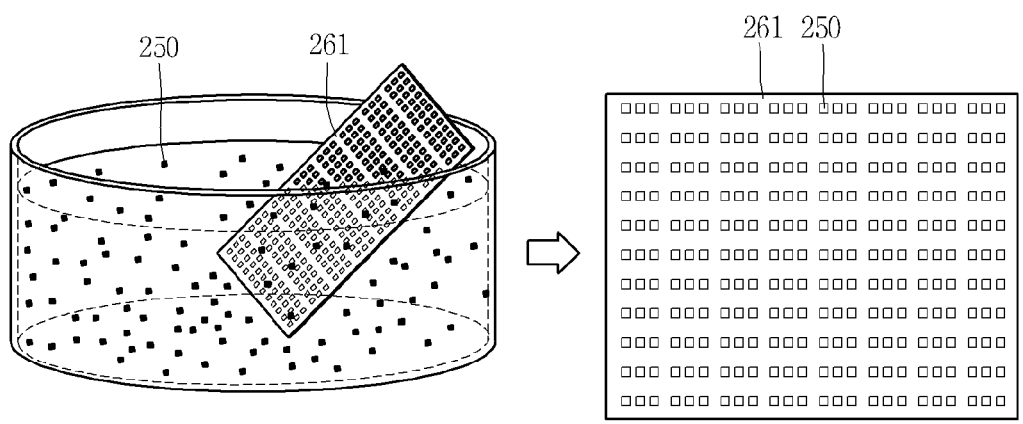

[FIG. 6]
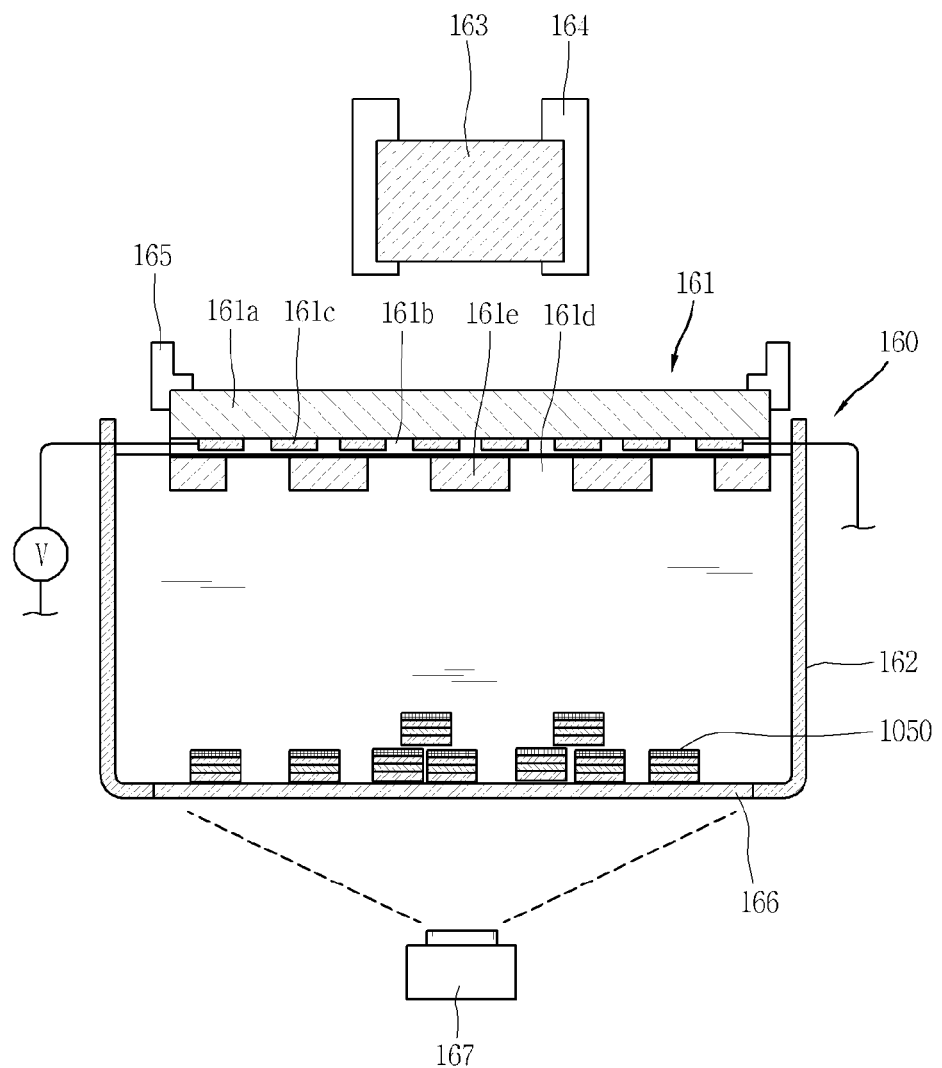

[FIG. 7]
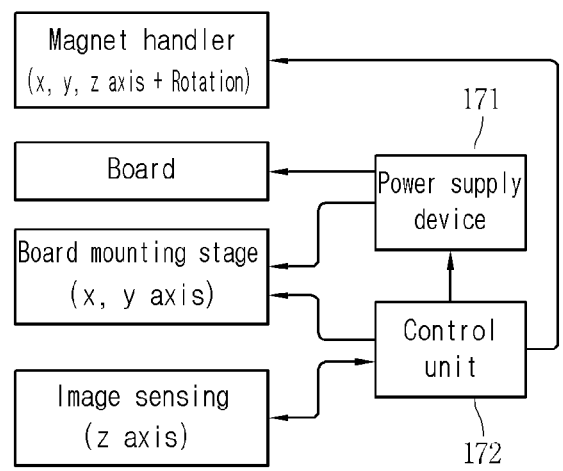

[FIG. 8a]
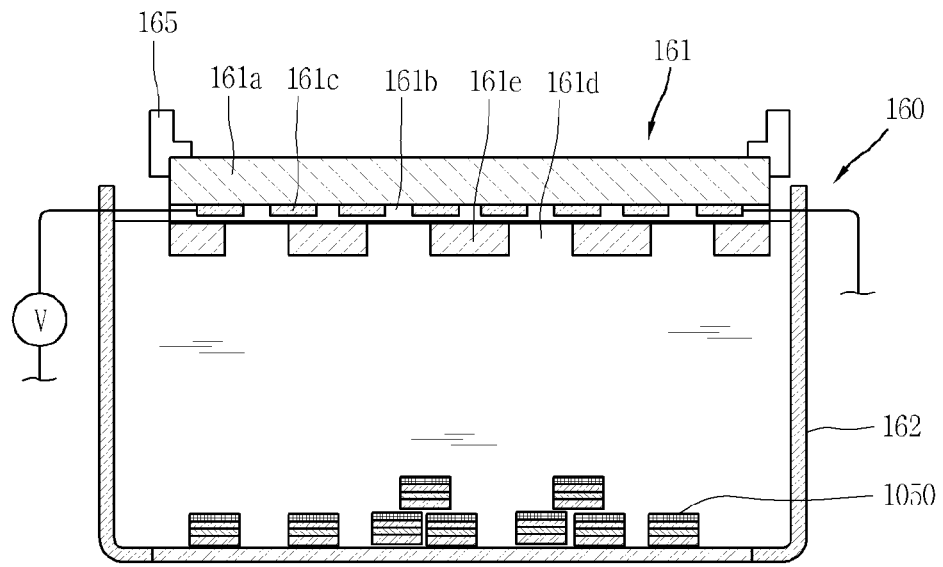
[FIG. 8b]
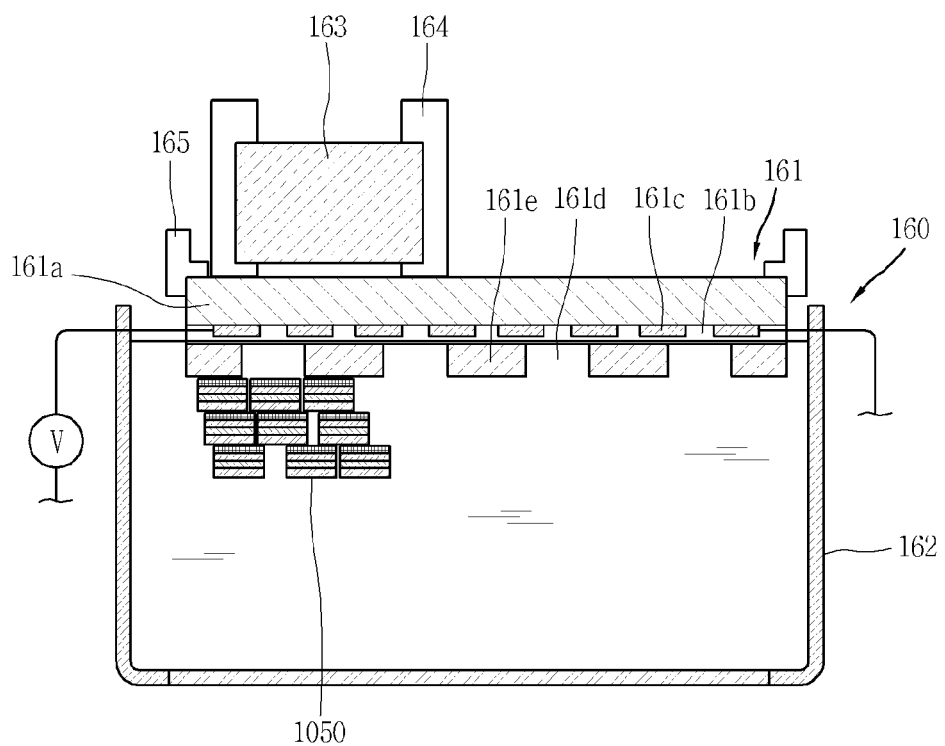

【FIG. 8c】
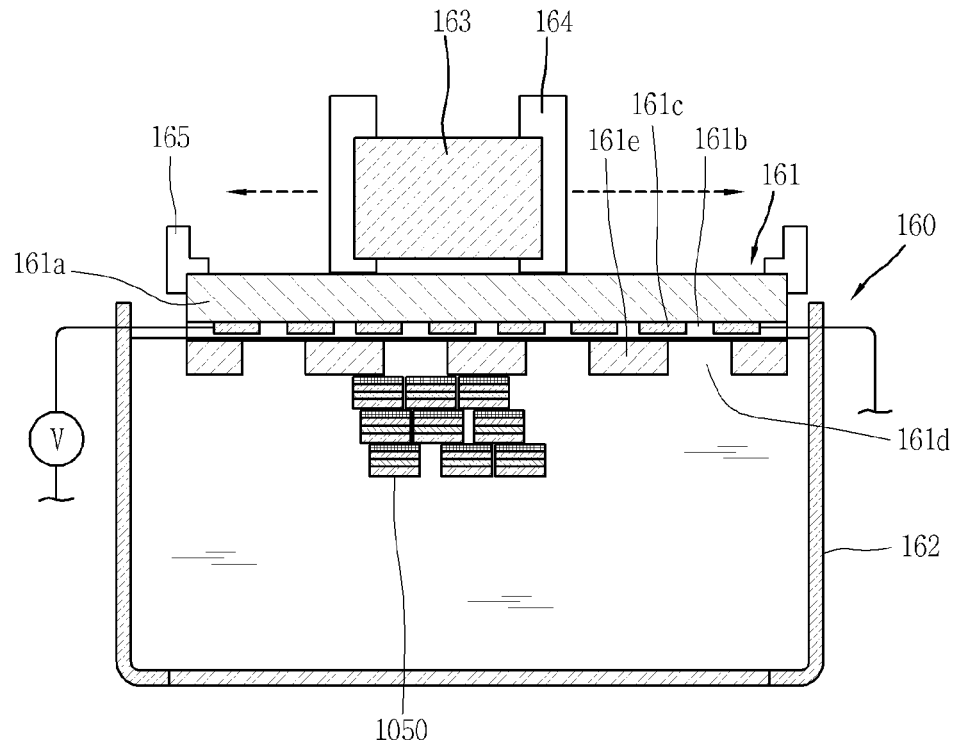
【FIG. 8d】
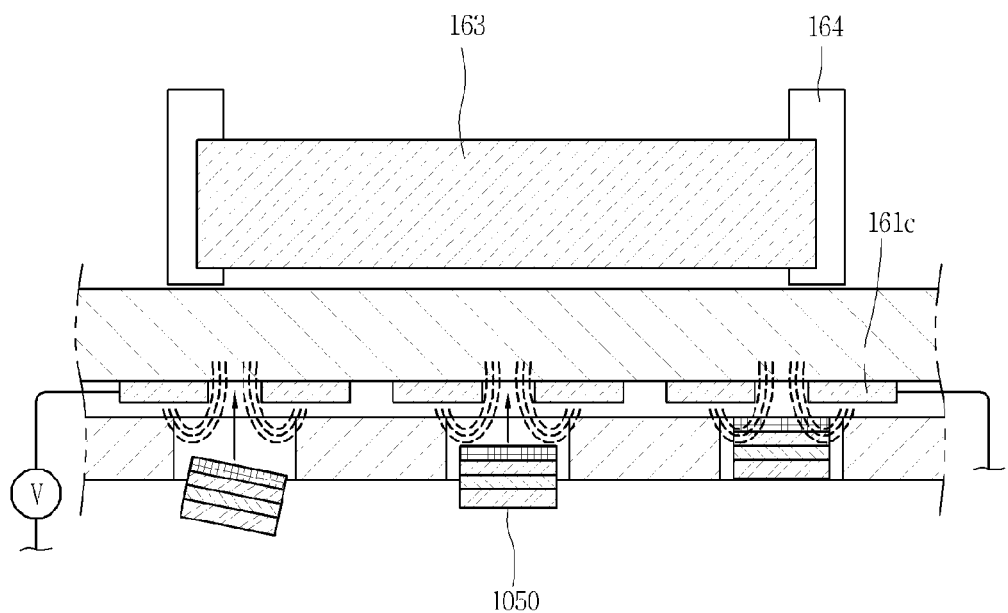

[FIG. 8e]
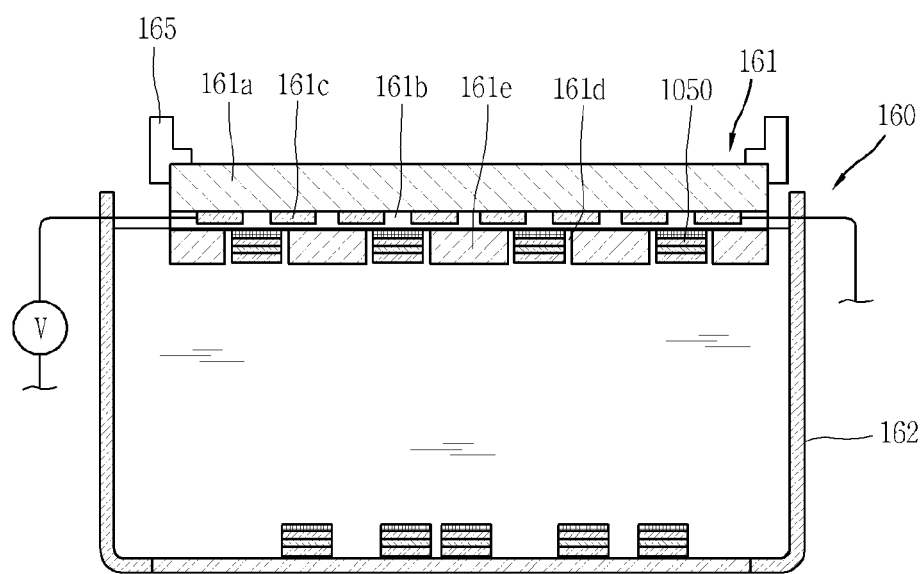

[FIG. 9]
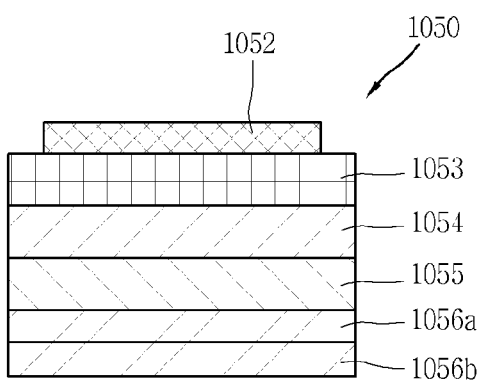

[FIG. 10]
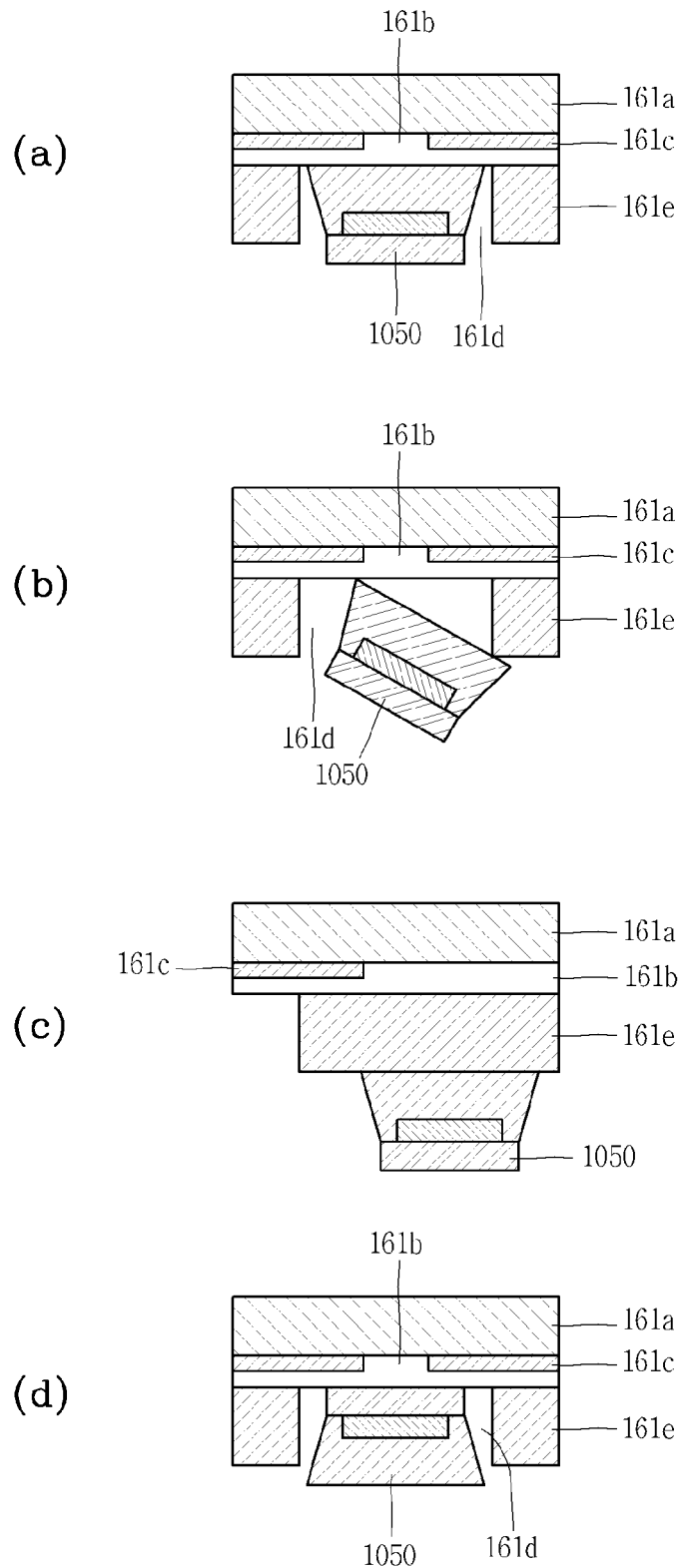

【FIG. 11】
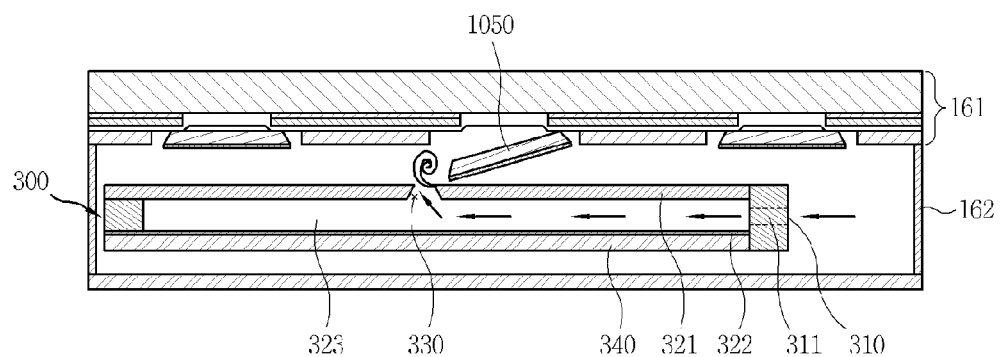
【FIG. 12】
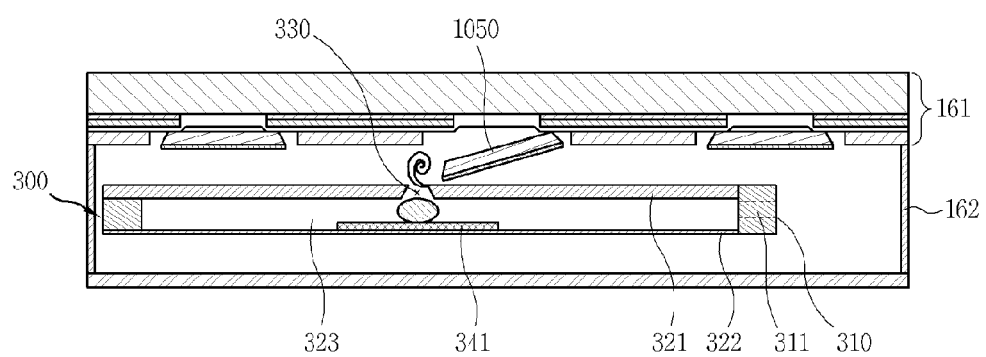

[FIG. 13]
(a)
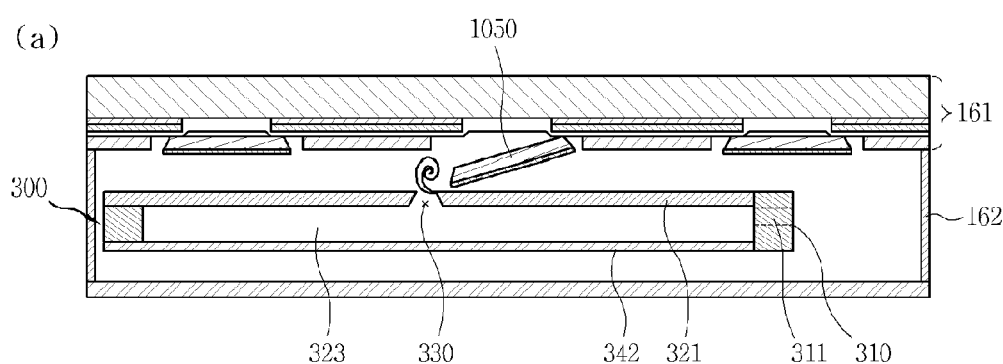
(b)
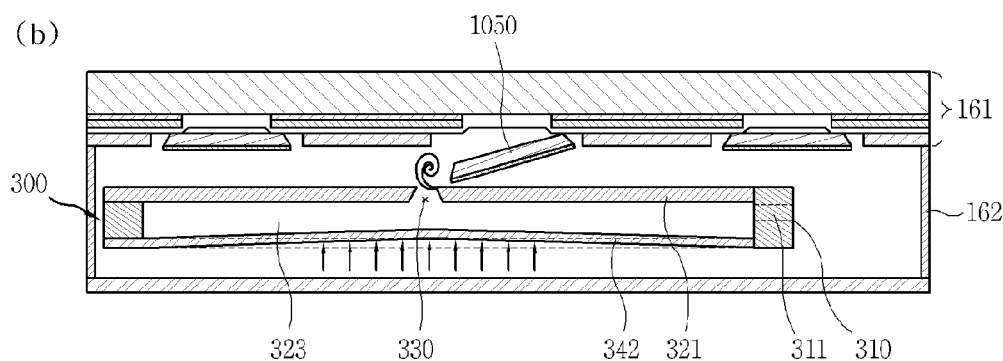

MODULE FOR REMOVING MISASSEMBLED SEMICONDUCTOR LIGHT-EMITTING ELEMENT, AND METHOD USING SAME TO REMOVE MISASSEMBLED SEMICONDUCTOR LIGHT-EMITTING ELEMENT

CROSS-REFERENCE TO RELATED APPLICATIONS

This application is the National Stage filing under 35 U.S.C. 371 of International Application No. PCT/KR2019/009699, filed on Aug. 5, 2019, the contents of which are all incorporated by reference herein in its entirety.

TECHNICAL FIELD

The present disclosure relates to a removal module for removing a mis-assembled semiconductor light emitting diode used to manufacture a display device using semiconductor light emitting diodes having a size of several to several tens of μm, and a method for removing the mis-assembled semiconductor light emitting diode using the same.

BACKGROUND ART

Recently, liquid crystal displays (LCD), organic light emitting diode (OLED) displays, and micro LED displays are competing to implement large-area displays in the display technology field.

However, in the case of LCD, there are problems such as slow response time and low efficiency of light generated by backlights, in the case of OLED, there are problems such as short lifespans, poor mass production yields, and low efficiency.

On the other hand, when a semiconductor light emitting diode (micro LED) having a diameter or cross-sectional area of 100 μm or less is used for a display, very high efficiency can be achieved because the display does not absorb light using a polarizing plate or the like. However, since a large display requires millions of semiconductor light emitting diodes, it is difficult to transfer the diodes compared to other technologies.

The technologies currently being developed for a transfer process may include pick & place technology, Laser Lift-off (LLO) technology, self-assembly technology or the like. Among them, the self-assembly technology is a method in which a semiconductor light emitting diode finds its own position in a fluid, and is the most advantageous method for realizing a large-screen display device.

However, it is necessary to solve the problem of mis-assembly of a semiconductor light emitting diode having a micro-level size by any method and to provide a method capable of removing a mis-assembled semiconductor light emitting diode which is optimized for assembly environment especially in a special assembly environment (e.g., assembly in a fluid, a narrow assembly space).

DISCLOSURE

Technical Problem

The present disclosure provides a removal module for selectively removing semiconductor light emitting diodes having a size of several to tens of μm mis-assembled on an assembly board in a fluid, and a method for removing the semiconductor light emitting diodes mis-assembled on the assembly board using the same.

Technical Solution

According to an embodiment of the present disclosure, a removal module for removing a mis-assembled semiconductor light emitting diode includes a housing having an inner space formed by an upper plate having a nozzle hole and a lower plate spaced apart from the upper plate; a fluid supply part configured to supply a fluid outside the housing to the inner space; and a fluid control part configured to control spray of the fluid supplied to the inner space through the nozzle hole by adjusting a pressure of the inner space.

In the present embodiment, the fluid control part may be a heating element configured to heat the inner space and may include a metal thin-film resistor.

In the present embodiment, the heating element may be formed in at least a first region of the lower plate, and the first region may include a region overlapping the nozzle hole.

In the present embodiment, the fluid control part may include a piezoelectric element configured to apply vibration to the inner space according to an application of a pulse.

In the present embodiment, the piezoelectric element may be formed in at least a first region of the lower plate, and the first region may include a region overlapping the nozzle hole.

In the present embodiment, the fluid control part may control at least one of an intensity of the pulse applied to the piezoelectric element and an application time of the pulse to control an amount of the fluid injected through the nozzle hole.

In the present embodiment, the fluid supply part may further include a filtration filter configured to filter out foreign substances contained in the fluid supplied to the inner space.

In the present embodiment, the removal module may be provided in a chamber containing the fluid in which a self-assembly of the semiconductor light emitting diodes with respect to an assembly board is made.

In the present embodiment, the fluid supply part may be configured to supply the fluid accommodated in the chamber to the inner space.

In the present embodiment, the removal module may further include a transfer part configured to move the housing so as to correspond to a position of the semiconductor light emitting diode mis-assembled on the assembly board.

According to an embodiment, a method for removing a mis-assembled semiconductor light emitting diode includes photographing an image or a video for one surface of an assembly board on which semiconductor light emitting diodes are seated after the semiconductor light emitting diodes put into a fluid accommodated in a chamber have been seated at preset positions on the assembly board using an electric field and a magnetic field; identifying whether the semiconductor light emitting diodes are mis-assembled and a position coordinate of an mis-assembled semiconductor light emitting diode based on the photographed image or video; positioning the removal module according to claim 1 under a point corresponding to an identified position coordinate; and removing the mis-assembled semiconductor light emitting diode from the assembly board by spraying a fluid toward a position where the semiconductor light emitting diode is mis-assembled, wherein the fluid contained in the chamber is sprayed to remove the mis-assembled semiconductor light emitting diode.

Advantageous Effects

According to the removal module for removing a mis-assembled semiconductor light emitting diode according to an embodiment of the present disclosure is provided in a fluid chamber to selectively remove the mis-assembled semiconductor light emitting diode by spraying a fluid to a specific site of an assembly board in which the semiconductor light emitting diodes having a size of about several to tens of μm are arranged at intervals of tens to hundreds of μm by self-assembly.

In particular, according to the present disclosure, since the mis-assembled semiconductor light emitting diode is removed using the fluid contained in the chamber, the structure of the removal module can be simplified and the fluid can be more precisely controlled.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8a to 8e are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIG. 10 is a view showing an assembly defect type of self-assembly according to the present disclosure.

FIG. 11 is a view showing a removal module according to an embodiment of the present disclosure.

FIG. 12 is a view showing a removal module to which a heating element (metal thin-film resistor) is applied as a fluid control part according to an embodiment of present disclosure.

FIG. 13 is a view showing a removal module to which a piezoelectric element is applied as a fluid control part according to an embodiment of present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function.

In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described in this specification may include a mobile phone, a smart phone, a laptop computer, a digital broadcasting terminal, a personal digital assistant (PDA), a portable multimedia player (PMP), a navigation system, and a slate PC, a tablet PC, an ultra book, a digital TV, a desktop computer and the like. However, the configuration according to the embodiment described in this specification can be applied as long as it can include a display even in a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a board of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5a).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 1059 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 1059 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 1061 using flow, gravity, surface tension, and the like. In this case, the board may be an assembled board 161.

As another example, it is also possible to put the wiring board in a fluid chamber instead of the assembled board 161 so that the semiconductor light emitting diodes 150 are directly seated on the wiring board. In this case, the board may be the wiring board. However, for convenience of description, in the present disclosure, the board is provided as, for example, the assembled board 161 on which the semiconductor light emitting diodes 1050 are seated.

Cells (not shown) in which the semiconductor light emitting diodes 150 are inserted may be provided in the assembled board 161 to facilitate mounting of the semiconductor light emitting diodes 150 on the assembled board 161. Specifically, cells in which the semiconductor light emitting diodes 150 are seated are formed in the assembled board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembled board 161, the semiconductor light emitting diodes of the assembled board 161 are transferred to a wiring board, enabling large-area transfer. Accordingly, the assembled board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8a to 8d are conceptual views illustrating a process of self-assembling a semiconductor light emitting diode using the self-assembly apparatus of FIG. 6, and FIG. 9 is a conceptual diagram for describing the semiconductor light emitting diode of FIGS. 8a to 8d.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, a assembly process using the self-assembly apparatus described above will be described in more detail.

First, a plurality of semiconductor light emitting diodes 1050 including a magnetic material are formed through the process described with reference to FIGS. 5a to 5c. In this case, in the process of forming the second conductivity type electrode of FIG. 5c, a magnetic material may be deposited on the semiconductor light emitting diode.

Next, the board 161 is transferred to a assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8*b*)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the substrate, clockwise or counterclockwise (FIG. 8*c*). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8*c*). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8*d*). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Meanwhile, in order to commercialize the above-described self-assembly method, it is necessary to secure assembly accuracy, and accordingly and provide a method for solving mis-assembly of the semiconductor light emitting diode 1050.

FIG. 10 is a view showing an assembly defect type of self-assembly according to the present disclosure. The semiconductor light emitting diode 1050 is normally assembled by being seated in a predetermined position of the assembly board 161, that is, in the cell 161*d*, by the self-assembly process described above (FIG. 10(*d*)). However, some semiconductor light emitting diodes 1050 are caught on the barrier ribs 161*e* surrounding the cells 161*d* when being seated in the cells 161*d*, so that they are not seated correctly in the cells 161*d* (FIG. 10(*a*)). Alternatively, the electric field holding the semiconductor light emitting diode 1050 in the cell 161*d* leaks to the outside, so that the semiconductor light emitting diode 1050 may be in an area other than the cell 161*d* (FIG. 10(*b*)). In addition, the above-described self-assembly semiconductor light emitting diode 1050 has a structure in which the selectivity of the assembly direction is secured by giving a difference in the surface area, and is generally seated such that the surface with a large surface area is in contact with the bottom surface of the cell 161*d*. In some cases, assembly may be also performed in the opposite direction (FIG. 10(*d*)).

The present disclosure relates to a module for removing a mis-assembled semiconductor light emitting diode in consideration of the specificity of self-assembly in a fluid (hereinafter, referred to as a removal module) and a method for removing a mis-assembled semiconductor light emitting diode using the same. An embodiment of the present disclosure will be described in more detail with reference to FIGS. 11 to 13.

FIG. 11 is a view showing a removal module according to an embodiment of the present disclosure, FIG. 12 is a view showing a removal module to which a heating element (metal thin-film resistor) is applied as a fluid control part according to an embodiment of present disclosure, and FIG. 13 is a view showing a removal module to which a piezoelectric element is applied as a fluid control part according to an embodiment of present disclosure.

Referring to FIG. 11, a removal module 300 according to an embodiment of the present disclosure may include a housing 320, a fluid supply part 310, and a fluid control part 340.

The removal module 300 according to an embodiment of the present disclosure is provided in a chamber containing a fluid in which the semiconductor light emitting diodes 1050 are self-assembled to the assembly board 161, and may remove mis-assembled semiconductor light emitting diodes 1050 from the assembly board 161 by injecting the fluid at a location where the light emitting diode 1050 is erroneously assembled.

First, the housing 320 may include an upper plate 321 and a lower plate 322 spaced apart from the upper plate 321, and the upper plate 321 and the lower plate 322 are may be fixed in a spaced apart state by sidewalls or spacers while maintaining constant intervals.

In one embodiment, the upper plate 321 and the lower plate 322 are formed of a transparent material such as glass or silicone, and as shown in FIG. 6, the alignment of the removal module 300 and the removal status of the mis-assembled semiconductor light emitting diode 1050 may be checked through an image sensor 167 disposed under the fluid chamber 162 in real time.

However, even when the upper plate 321 and the lower plate 322 are not formed of a transparent material, a separate sensor is additionally provided to enable checking of the alignment state of the removal module 300 and the removal status of the mis-assembled semiconductor light emitting diode 1050.

Meanwhile, according to an embodiment of the present disclosure, a nozzle hole 230 through which a fluid for removing the mis-assembled semiconductor light emitting diode 1050 is sprayed is formed in the upper plate 321. Accordingly, the upper plate 321 may face the assembly board 161, and the lower plate 322 may be provided in the chamber 162 to face the bottom surface of the chamber 162.

The housing 320 may have an inner space 323 formed by the upper plate 321 and the lower plate 322, and a fluid to be sprayed toward the mis-assembled semiconductor light emitting diode 1050 may be hold in the inner space 323.

The upper plate 321 may have a nozzle hole 330 that communicates the inner space 323 and the chamber 162, and the nozzle hole 330 may be a configuration for spraying a fluid toward a mis-assembly site of the assembly board 161.

The fluid supplied from the fluid supply part 310 may be sprayed through the nozzle hole 330 to the mis-assembly site of the semiconductor light emitting diode 1050 on the assembly board 161 to remove the mis-assembled semiconductor light emitting diode 1050 from the assembly board 161.

The nozzle hole 330 is not limited in the shape thereof, like a circular hole, a slit hole or the like, and the width of the nozzle hole 330 may be constant depending on the material or process of the upper plate 321, or as shown in the accompanying drawings, may have a shape that becomes narrower toward the top. Alternatively, the nozzle hole 330 may be formed to protrude from the upper plate 321.

The fluid supply part 310 for supplying a fluid outside the housing 320 to the inner space 323 may be connected to one side of the housing 320. According to the present embodiment, the fluid supply part 310 may supply the fluid accommodated in the chamber 162 to the inner space 323 of the housing 320.

Specifically, the fluid supply part 310 may include a channel 311 communicating the chamber 162 and the inner space 232 in order to supply the fluid in the chamber 162 to the inner space 323. Although the channel 311 communicating in the horizontal direction is shown in FIG. 11, a structure of the channel 311 to which the fluid in the chamber 162 may be supplied through the upper or lower portion of the fluid supply part 310 is also possible.

In addition, the fluid supply part 310 may include a valve (not shown) for generating a flow of fluid from the outside of the housing 320 to the inner space 323 of the housing 320, for example, may include a different type of valve according to the structure (the flow direction of the fluid) of the channel 311.

On the other hand, in general, since de-ionized water in a state in which all ions are removed is used during self-assembly, the fluid in the chamber 162 may be used immediately in removing the mis-assembled semiconductor light emitting diode 1050. However, as the assembly board 161 for self-assembly, the semiconductor light emitting diode 1050, and the like are repeatedly injected into the fluid, the possibility that foreign substances are present in the fluid cannot be excluded.

Accordingly, the fluid supply part 310 may further include a filtration filter (not shown) for filtering out foreign substances included in the fluid supplied to the inner space 323.

For example, the filtration filter may include a porous membrane, an ion exchange resin filter, or the like, and may filter out foreign substances contained in the injected fluid, purify the fluid, and the fluid may be supplied to the inner space of the housing 323 after the fluid is purified.

That is, the fluid in the chamber 162 injected into the fluid supply part 310 may become a super-purified state in which all foreign substances are removed by using a filtration filter, and may be supplied to the inner space 323 of the housing 320 to be used to remove the mis-assembled semiconductor light emitting diode 1050.

Meanwhile, the fluid control part 340 may be provided on the other side of the housing 320. The fluid control part 340 may control the spray of the fluid supplied to the inner space 323 through the nozzle hole 330 by adjusting the pressure of the inner space 323.

Specifically, the fluid control part 340 may adjust the pressure of the inner space 323 by changing the volume of the inner space 322 by applying temperature or vibration, and control the spray of the fluid. The fluid control part 340 may employ an inkjet spray method (bubble jet method and piezo method).

In one embodiment, the fluid control part 340 may heat the inner space 323 to form bubbles in the fluid, and spray the fluid in the inner space 323 to the outside through the nozzle hole 330 due to a difference in volume caused by the bubbles.

In this regard, referring to FIG. 12, the fluid control part 340 may include a metal thin film resistor as a heating element 341 that heats the inner space 323. For example, the metal thin film resistor may heat the inner space 323 (about 300° C. or higher) with resistance heat generated when an external power (electrical signal) is applied, and may generate bubbles in the inner space 323. The volume of the inner space 323 is momentarily reduced due to the expansion of the bubbles, and thus, a portion of the fluid supplied to the inner space 323 may be discharged to the outside through the nozzle hole 330.

In addition, the bubbles formed by heating may be discharged to the outside together when the fluid is sprayed or disappear as the heat supply is stopped, and may not affect the operation of the removal module 300.

Meanwhile, the heating element 341 may be formed on the entire lower plate 322 or at least in a first region of the lower plate 322. As shown in FIG. 13, the first region is a region including an area on the lower plate 322 overlapping the nozzle hole 330, and may mean an area overlapping the nozzle hole 330 and a surrounding area thereof.

In another embodiment, the fluid control part 340 may generate vibration in the inner space 323, and the fluid in the inner space 323 may be sprayed to the outside through the nozzle hole 330 due to a difference in volume during vibration. In this case, a piezoelectric element 342 may be provided as the fluid control part 340.

The piezoelectric element 342 may be applied to at least a portion of the lower plate 322 of the housing 320, and is deformed when a pulse is applied from the outside to cause mechanical vibration in the inner space 323 of the housing 320. The inner space 323 is momentarily reduced in volume when a strong pressure is applied, and a part of the fluid supplied to the inner space 323 may be discharged to the outside through the nozzle hole 330 (see FIGS. 14(a) and (b)).

Like the heating element 341, the piezoelectric element 342 may be formed in at least the first region of the lower plate 322, that is, in an area including an area of the lower plate 322 overlapping the nozzle hole 330, or may be applied to the entire lower plate 322 as shown in FIG. 14.

The lower plate 322 is formed of a deformable material, and may be deformed by vibration of the piezoelectric element 342. When the piezoelectric element 324 is applied to a portion of the lower plate 322, deformation may occur only in the area to which the piezoelectric element 324 is applied.

The fluid control part 340 may control the amount of fluid sprayed through the nozzle hole 330 by adjusting at least one of the intensity of the pulse applied to the piezoelectric element 342 and the application time of the pulse.

A fluid control method for the fluid control part 340 as described above may be suitable to selectively remove only the semiconductor light emitting diode 1050 at a specific position among the semiconductor light emitting diodes 1050 arranged at intervals of tens to hundreds of μm because it is possible to spray the fluid by a simple method, and provide high precision.

On the other hand, the removal module 300 according to the embodiment of the present disclosure may include a transfer part (not shown) for aligning the position of the removal module 300, and the removal module 300 may be aligned to correspond to a mis-assembly site on the assembly board 161 by the transfer part.

The semiconductor light emitting diodes 1050 may be arranged in a plurality of rows and columns (matrix form) on the assembly board 161, and the semiconductor light emitting diodes 1050 may be arranged at intervals of several tens to hundreds of μm along the plurality of rows and columns. For example, the semiconductor light emitting diodes 1050 may be arranged in a row direction at intervals of several tens of μm, and may be arranged in a column direction at intervals of several hundreds of μm.

The transfer part may move the housing 320 in horizontal and vertical directions such that the removal module 300 corresponds to the position of the semiconductor light emitting diode 1050 mis-assembled on the assembly board 161. The transfer part may have a general configuration used to align the position of equipment, and may include, for example, a transfer rail, a motor, and the like.

When a mis-assembly site is detected, the housing 320 may be horizontally moved on a virtual plane parallel to the assembly board 161 by the transfer part to be first aligned under the assembly board 161, and be vertically moved so as to be close to the assembly board 161 to be finally aligned.

As described above, the removal module 300 according to an embodiment of the present disclosure may be provided in the fluid chamber 162 to spray a fluid to a specific site of the assembly board 161 in which semiconductor light emitting diodes 1050 having a size of about several to several tens of μm are arranged at intervals of several tens or several hundreds of μm, thereby selectively removing the mis-assembled semiconductor light emitting diode 1050.

In particular, according to the present disclosure, since the mis-assembled semiconductor light emitting diode is removed by using the fluid contained in the chamber 162, the structure of the removal module 300 may be simplified, and the inkjet spray method may be employed to configure the fluid control part 340, thus providing an effect of more precisely controlling the spray of the fluid.

Next, as a post-process of self-assembly, a method of removing the semiconductor light emitting diode 1050 mis-assembled on the assembly board 161 using the above-described removal module 300 will be described.

The removal module 300 according to an embodiment of the present disclosure may be used to remove the semiconductor light emitting diode 1050 mis-assembled on the assembly board 161 as shown in FIG. 10 after the semiconductor light emitting diodes 1050 injected into the fluid contained in the chamber 162 are self-assembled to the assembly board 161 using an electric field and a magnetic field, and may be provided in the fluid chamber 162 to remove the mis-assembled semiconductor light emitting diode 1050 in a manner of spraying the fluid to a position where the semiconductor light emitting diode 1050 is mis-assembled.

The process for removing the mis-assembled semiconductor light emitting diode is a process performed after the self-assembly is completed, wherein the self-assembly may mean seating the semiconductor light emitting diodes 1050 injected into the fluid in preset positions of the assembly board 161, that is, in the cell 161d.

The semiconductor light emitting diodes 1050 floating in the fluid may be seated in the cells 161d by being subjected to the electric and magnetic fields applied from the assembly board 161 and the upper side of the assembly board 161, and in this process, some semiconductor light emitting diodes 1050 may not be normally assembled as shown in FIG. 10.

The present disclosure relates to a method for removing the semiconductor light emitting diode 1050 mis-assembled on the assembly board 161 using the above-described removal module 300, and the following steps may be performed.

First, by using the image sensor 167 provided outside the fluid chamber 162, an image or a video of one surface of the assembly board 161 in which self-assembly has been completed (a surface on which the semiconductor light emitting diode 1050 is seated, which is disposed to face the bottom surface of the fluid chamber 162) is photographed, and whether the semiconductor light emitting diodes 1050 are mis-assembled and the coordinates of the positions of the mis-assembled semiconductor light emitting diodes 1050 may be identified from the photographed image or video.

For example, it is possible to identify that the semiconductor light emitting diode 1050 is seated in the cell 161d in a different direction and also identify the position coordinates of the corresponding cell (hereinafter, referred to as mis-assembly site X), through the photographed image or video. The cells 161d in which the semiconductor light emitting diodes 1050 are seated are formed in a matrix form in the assembly board 161, and the semiconductor light emitting diodes 1050 may be arranged in a matrix form on the assembly board 161. Therefore, the position coordinates of the mis-assembly site X may be expressed as row and column coordinates (x, y).

After identifying the position coordinates of the mis-assembly site X, the removal module 300 may be placed in the fluid chamber 162, and the removal module 300 may be positioned under a point corresponding to the identified position coordinates. The removal module 300 may be moved horizontally and vertically to be aligned at a position for fluid spray.

First, the removal module 300 may be moved horizontally such that the nozzle hole 330 of the removal module 300 corresponds to the position coordinates (x, y) of the mis-assembly site X. Horizontal movement may mean movement on a virtual horizontal plane (xy plane) parallel to the assembly board 161, and horizontal movement may correspond to movement for position alignment between the mis-assembly site X and the removal module 300.

Next, when the horizontal movement is completed, the vertical movement of the removal module 300 is made. The vertical movement may be a movement for bringing the upper plate 321 of the removal module 300 and one surface of the assembly board 161 closer to each other.

Next, the fluid is sprayed toward a position in which the semiconductor light emitting diode 1050 is mis-assembled, that is, the mis-assembly site X to remove the mis-assembled semiconductor light emitting diode 1050 from the assembly board 161.

The nozzle hole 330 may inject the fluid toward a certain region within the mis-assembly site X, for example, may inject the fluid with a gap formed between the semiconductor light emitting diode 1050 and the cell 161d. In this case, the fluid sprayed through the nozzle hole 330 may be a fluid accommodated in the chamber 162, and may be supplied to the inner space 323 of the housing 320 through the fluid supply part 310.

For example, the process of supplying the fluid to the inner space 323 of the housing 320 may be performed after the position coordinates of the mis-assembly site X is identified or before the vertical movement is performed after the removal module 300 is arranged according to the horizontal movement.

When the mis-assembled semiconductor light emitting diode 1050 is removed from the assembly board 161 through the above operations, operation of reassembling the semiconductor light emitting diode 1050 at a corresponding position may be performed.

As described above, by performing the operation of removing the semiconductor light emitting diodes 1050 mis-assembled on the assembly board 161 as a post-process of the self-assembly process in the fluid chamber 162 in which the self-assembly has been completed, it is possible to secure the process yield for manufacture of a display device.

The above-described present disclosure is not limited to the configuration and method of the above-described embodiments, but the embodiments may be configured by selectively combining all or part of each embodiment such that various modifications can be made.

The invention claimed is:

1. A removal module for removing a mis-assembled semiconductor light emitting diode (LED), comprising:
   a housing having an inner space defined between an upper plate with a nozzle hole and a lower plate spaced apart from the upper plate;
   a channel configured to supply a fluid from outside the housing to the inner space; and
   a fluid control part comprising a metal thin-film resistor as a heating element or a piezoelectric element, the fluid control part configured to control a spray of the supplied fluid through the nozzle hole and against gravity towards the mis-assembled semiconductor LED by adjusting a pressure of the inner space,
   wherein the removal module is provided in a chamber having the fluid in which semiconductor LEDs are made via self-assembly with respect to an assembly board, and
   wherein the channel is further configured to supply the fluid accommodated in the chamber to the inner space.

2. The removal module of claim 1, wherein the fluid control part comprises the metal thin-film resistor to heat the inner space.

3. The removal module of claim 2, wherein the heating element is disposed at at least a first region of the lower plate, and wherein the first region comprises a region overlapping the nozzle hole.

4. The removal module according to claim 1, wherein the fluid control part comprises the piezoelectric element configured to apply vibration to the inner space according to an application of a pulse.

5. The removal module according to claim 4, wherein the piezoelectric element is disposed at at least a first region of the lower plate, and wherein the first region comprises a region overlapping the nozzle hole.

6. The removal module according to claim 4, wherein at least one of an intensity of the pulse applied to the piezoelectric element or an application time of the pulse for controlling an amount of the fluid injected through the nozzle hole is controlled.

7. The removal module of claim 1, wherein the channel further comprises a filtration filter configured to filter out foreign substances in the fluid supplied to the inner space from the chamber.

8. The removal module of claim 1, further comprising:
   a motor configured to move the housing to correspond to a position of a semiconductor LED mis-assembled on the assembly board.

* * * * *